United States Patent [19]
Barczys

[11] Patent Number: 4,885,557
[45] Date of Patent: Dec. 5, 1989

[54] BROADBAND CONSTANT VOLTAGE MULTICOUPLER

[76] Inventor: Daniel A. Barczys, 32 Hess Pl., Lancaster, N.Y. 14086

[21] Appl. No.: 229,244

[22] Filed: Aug. 8, 1988

[51] Int. Cl.$^4$ .............................................. H03H 7/48
[52] U.S. Cl. .................................... 333/124; 333/125
[58] Field of Search ............... 333/124, 125, 127, 128, 333/100

[56] References Cited

U.S. PATENT DOCUMENTS

| | | | |
|---|---|---|---|
| 3,336,540 | 8/1967 | Kwartiroff et al. | 333/124 X |
| 4,129,839 | 12/1978 | Galani et al. | 333/128 |
| 4,725,794 | 2/1988 | Barczys | 333/124 X |

Primary Examiner—Paul Gensler
Attorney, Agent, or Firm—Christel, Bean & Linihan

[57] ABSTRACT

A broadband, constant voltage multicoupler including an input port and a plurality of output ports wherein the impedance rises in the same proportion as the power falls in the internal branches so that the voltage is substantially constant therein. The multicoupler comprises a signal splitter transmission line network having an electrical characteristic which maintains the same voltage throughout and a plurality of active devices associated therewith. In particular, the signal splitting network comprises a first transmission line connected at one end to the input and terminating at the opposite end, and a plurality of additional transmission lines having an impedance equal to n times the impedance of the first transmission line where n equals the number of the outputs. The active devices are in the form of buffer amplifiers, one for each of the outputs, each of the active devices having an input connected to one of the additional transmission lines and each of the active devices properly terminating the corresponding transmission line and providing a desirable output impedance value. As a result, the voltage level at the terminations of the additional transmission lines is substantially the same as the voltage at the input resulting in substantially no degradation of signal to noise ratio. This, in turn, allows the multicoupler to be connected directly to a signal source without need for a preamplifier. In addition, the transmission lines are properly terminated so as to be length-independent and frequency independent thereby advantageously resulting in broadband operation.

14 Claims, 3 Drawing Sheets

BROADBAND CONSTANT VOLTAGE MULTICOUPLER

BACKGROUND OF THE INVENTION

This invention relates to the art of communications circuits, and more particularly to a new and improved multicoupler characterized by broadband, constant voltage operation.

In communication systems, for many reasons a single signal source is desired to be distributed among several utilization devices, and for this purpose a power divider is used. A typical example is a single antenna supplying a plurality of receivers. A power divider of N output ports develops 1/N of the input power at each of the output ports. When the input and output impedances are equal, the output voltage is reduced also. Fifty ohm input and output impedances generally are used to allow standard coaxial cables to be used for interconnection to other equipment. If such power divider were placed directly at the antenna output port and before a communications receiver, the voltage reduction or signal loss would add directly to the noise figure of the receiver and, in effect, degrade the sensitivity of the receiver. Therefore, standard practice is to place a preamplifier ahead of the power divider of sufficient gain so that no loss of sensitivity occurs.

One disadvantage of the foregoing arrangement is that significant demand is on proper amplifier characteristics which will not allow performance degradation in situations of high off-channel interfering signals. High gain of course increases the effect of already strong signals. The requirement of the preamplifier also undesirably complicates expansion of an existing system to a larger number of output ports, often by requiring rearrangement of components within the multicoupler, and also by requiring additional preamplifiers which, in turn, due to the increased amplification can cause already strong off-channel signals to be increased to the point of causing intermodulation and other distortion effects. Another disadvantage of the foregoing power divider is that it typically includes transmission lines which are odd multiples of one-quarter wavelength to act as impedance transformers. As a result, the frequency dependence of the transmission lines causes the power divider to have limited bandwidth.

It would, therefore, be highly desirable to provide a multicoupler wherein the voltage is substantially the same at the input and outputs such that the signal to noise ratio is substantially unaffected, which has the ability to duplicate a low level input signal at multiple output ports with no restriction on bandwidth of operation, and which can be placed directly at the signal source without the need for a preamplifier.

SUMMARY OF THE INVENTION

It is, therefore, a primary object of this invention to provide a new and improved multicoupler for use in communications systems.

It is a more particular object of this invention to provide such a multicoupler characterized by constant voltage operation.

It is a further object of this invention to provide such a multicoupler characterized by broadband operation.

It is a further object of this invention to provide such a multicoupler which can be connected directly to a signal source without the need for a preamplifier.

It is a more particular object of this invention to provide such a multicoupler which produces substantially no degradation in signal to noise ratio.

It is a more particular object of this invention to provide such a multicoupler wherein the operation is frequency independent.

It is a more particular object of this invention to provide such a multicoupler which is easily expandable in the number of output ports.

It is a more particular object of this invention to provide such a multicoupler wherein the transmission lines thereof have non-critical lengths.

The present invention provides a broadband, constant voltage multicoupler including an input port and a plurality of output ports wherein the impedance rises in the same proportion as the power falls in the various branches between the input and outputs so that the voltage is substantially constant at all ports. The multicoupler comprises a signal splitter in the form of a transmission line network having an electrical characteristic which maintains the same voltage throughout and a plurality of active devices associated with the outputs to produce the desired output impedance value. In particular, the signal splitting network comprises a first transmission line connected at one end to the input and terminating at the opposite end, the transmission line having a given impedance, and a plurality of additional transmission lines, one for each of the outputs, each of the additional transmission lines connected at one end to the termination of the first transmission line at a junction and each of the additional transmission lines being terminated and coupled at the opposite end thereof to a corresponding one of the outputs, each of the additional transmission lines having an impedance equal to n times the impedance of the first transmission line where n equals the number of the outputs. There is also provided a plurality of active devices in the form of buffer amplifiers, at least one for each of the outputs, each of the active devices having an input connected to the opposite end or termination of one of the additional transmission lines and an output connected to a corresponding one of the multicoupler outputs, each of the active devices providing a desired output impedance value. As a result, the voltage level at each of the terminations of the additional transmission lines is substantially the same as the voltage at the input advantageously resulting in substantially no degradation of signal to noise ratio. This, in turn, advantageously allows the multicoupler to be connected directly to a signal source without need for a preamplifier. In addition, the transmission lines are matched so as to be length-independent and frequency independent thereby advantageously resulting in broadband operation.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENTS

Figure 1:
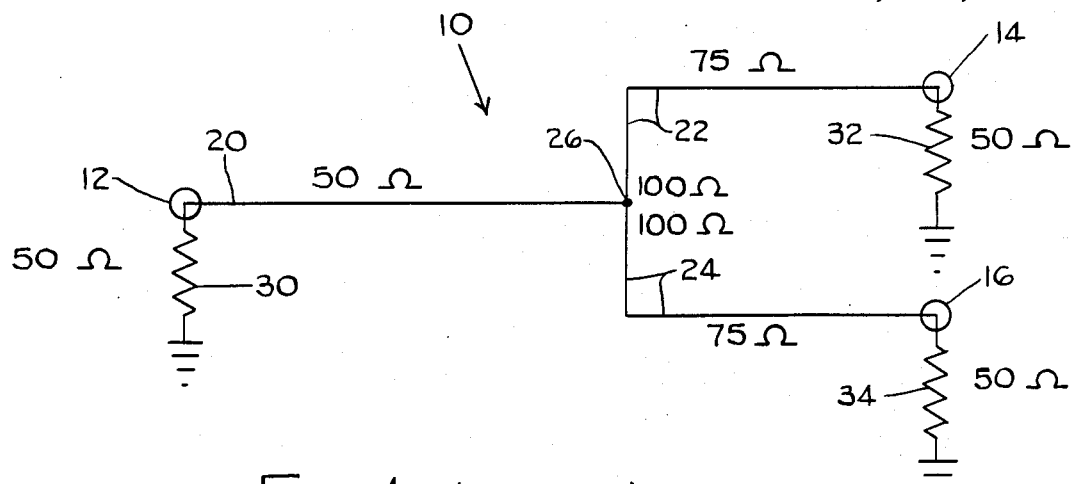
FIG. 1 is a schematic circuit drawing of a prior art power divider.

Referring to FIG. 1 there is shown a prior art power divider 10 having a single input 12, a pair of outputs 14,16 and a transmission line network therebetween. The network includes a single transmission line 20 connected at one end to input 12 and a pair of branch transmission lines 22,24 each connected at one end to a corresponding output 14,16 and each connected at the other end to a junction with the other end of the transmission line 20. Matching impedances 30, 32 and 34 are connected to input 12 and to outputs 14 and 16, respectively and represent source and load impedances. By way of example, transmission line 20 has an impedance of 50 ohms, transmission lines 22 and 24 have impedances of 75 ohms each, and each impedance 30, 32 and 34 is a standard 50 ohm matching impedance.

The prior art power divider of FIG. 1 reduces the power proportionately to the number of output ports and reduces the voltage also, as the impedances are stepped down to the proper 50 ohm value at the output ports. The 75 ohm branch transmission lines 22,24 are odd multiples of one quarter wave length to act as impedance transformers. The two 100 ohm values seen at the junction 26 by transmission lines 22 and 24 provide a match to the 50 ohm input transmission line 20, but each odd quarter wave length 75 ohm line 22,24 transforms the value at junction 26 to a 50 ohm value at the output. Bandwidth is limited because of the frequency dependence of the output lines. While the voltage is identical at the three ports of the junction 26, it is reduced by the quarter wave length transformer to $1/\sqrt{N}$ at the output port where N equals the number of output ports.

For a two or four port power divider of the prior art, the foregoing signal loss is 3 db or 6 db, respectively, plus a small inefficiency loss. If the prior art power divider were to be placed directly at an antena output port and before a communications receiver, this loss would add directly to the noise figure of the receiver and in effect degrade the sensitivity of the receiver. Accordingly, standard practice is to place a preamplifier ahead of the prior art power divider which amplifier has sufficient gain such that no loss of sensitivity occurs. When large numbers of output ports are desired, total power divider losses are large and sometimes two preamplifiers are used in cascade.

The foregoing arrangement is called a receiver multicoupler, wherein preamplification usually is followed by binary division of outputs. Unfortunately, when a small system is expanded in the field to a larger system, an expensive and complicated expansion generally is required. The extra components are not all placed at the output but some are required to be placed inside the existing component string. This relocation of components at a user's location makes for difficulty in expansion. In addition, the second amplifier, when added, produces very large signal amplification and many times causes already strong off-channel signals to be increased to the point of causing intermodulation and other distortion effects.

Figure 2:
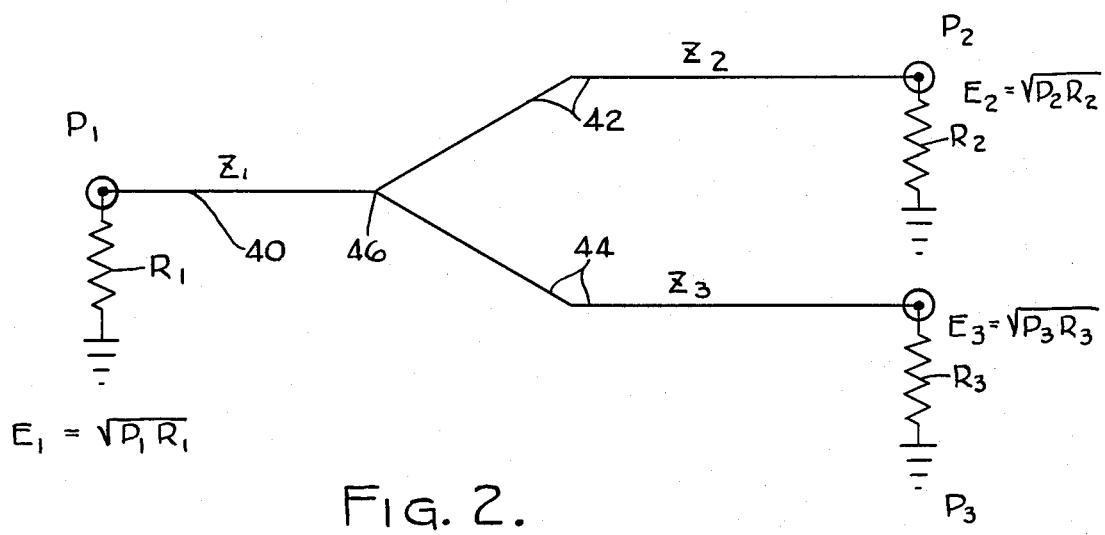
FIG. 2 is a schematic circuit diagram of a generalized signal splitting network.

FIG. 2 shows a signal splitting network in the general case including an input transmission line 40 having impedance Z1 and a pair of branch transmission lines 42 and 44 having impedances Z2 and Z3, respectively. An input matching impedance is designated R1 and output matching impedances are designated R2 and R3. The input power is P1 and the output power in the respective branches is P2 and P3. Similarly, input voltage is E1 and output voltages in the branches are designated E2 and E3. In the network of FIG. 2, at the connection point 46 where transmission lines 42,44 are connected to input transmission line 40, one voltage is present. If no change in impedance occurs along either of the transmission lines 40 or 42 or 44 this voltage remains constant throughout both transmission lines. For $E_1=E_2=E_3$ to occur, the particular products $P_1R_1$, $P_2R_2$, $P_3R_3$ must remain constant. This occurs when the particular P and R values vary equally but inversely, i.e. P is halved, R must double. As a result, the input signal voltage is reproduced at both transmission lines. Power is split into the two output transmission lines but this is of no consequence since amplifiers used in other portions of the system are either voltage or current sensitive.

If the two transmission lines 42 and 44 do not provide a proper match to the input transmission line 40, some power is reflected back to the source and a standing wave exists on all transmission lines. The voltage is identical in all transmission lines as before, but depending upon the mismatch the bandwidth of operation may be limited because the signal maximums and minimums will move along the transmission line with frequency shift. If the two transmission lines 42 and 44 provide a proper match but are of different impedance values, the power is split unevenly into the transmission lines 42 and 44. The voltage is equal throughout all of the transmission lines. The operation would be satisfactory but needlessly complicated. For example, if the impedance Z2 of transmission line 42 is 200 ohms and the impedance Z3 of transmission line 44 is 67 ohms, the power P2 at the output of transmission line 42 is $E^2/200$ and the power P3 at the output of transmission line 44 is $E^2/67$. The parallel value of the impedances is $Z2Z3/(Z2+Z3)=50$ ohms which matches the input transmission line 40. The voltage at the 50 ohm common junction point 46 is maintained in each of the transmission lines 42 and 44, although the power is unevenly split.

The simplest configuration to maintain input signal level according to the present invention is where the impedances in the branch transmission lines 42 and 44 are equal. For two output transmission line branches attached to an input transmission line having an impedance of X ohms, each branch transmission line should have an impedance of 2X ohms. Similarly, if 3, 4 or more branch transmission lines are connected to an input transmission line at a common junction or point, the impedance of each branch transmission line should be 3, 4 or more times the value of the impedance of the input transmission line. No difficulty is seen in providing a good match using practical transmission lines, whether by coaxial cables or by other techniques. Small mismatch values are acceptable. For example, having a mismatch of 1.5:1 in voltage standing wave ratio, i.e. VSWR, produces a voltage variation of 20 percent which is less than 1 dB and is acceptable.

Figure 3:
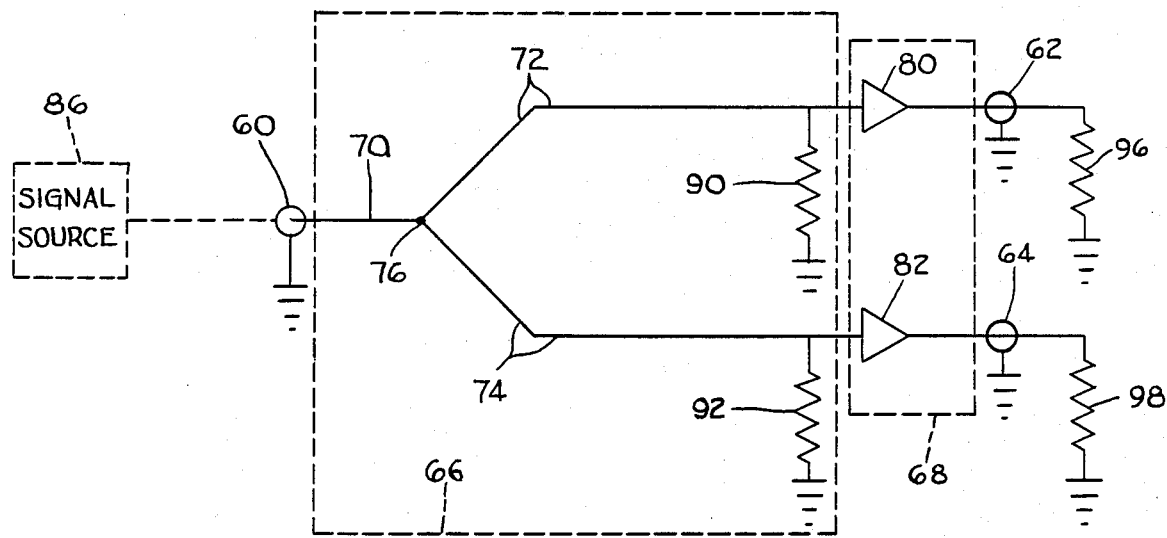
FIG. 3 is a schematic circuit diagram of a multicoupler according to the present invention.

FIG. 3 shows a broadband, constant voltage multicoupler according to the present invention. The multicoupler includes an input port 60 and a plurality of output ports, in the present illustration the two output ports 62 and 64, wherein the impedance rises in the same proportion as the power falls in the various branches between the input and outputs so that the voltage is substantially constant at all ports. The multicoupler comprises a signal splitter in the form of a transmission line network generally designated 66 having an electrical characteristic which maintains the same voltage throughout, and a plurality of active devices, generally designated 68, associated with the outputs to produce the desired output impedance value. In particular, the signal splitting network 66 comprises a first transmission line 70 connected at one end to the input 60 and terminating at the opposite end, and having a given impedance. The network 66 further includes a plurality of additional transmission lines, one for each of the outputs, in the present example the two transmission lines 72 and 74. Each of the additional transmission lines 72,74 is connected at one end to the termination of the first transmission line 70 at a junction designated 76. Each of the additional transmission lines 72,74 is terminated and coupled at the opposite end thereof to a corresponding one of the outputs 62,64, respectively. Each of the additional transmission lines 72,74 has an impedance equal to n times the impedance of the first transmission line 70 wherein n equals the number of the outputs, in the present illustration two. Thus, if the impedance of transmission line 70 is 50 ohms, the impedance of each transmission line 70,74 is 100 ohms because n equals two.

The multicoupler of the present invention also includes a plurality of active devices in the form of buffer amplifiers designated 80 and 82, one for each of the outputs 62 and 64, respectively. Each of the active devices 80 and 82 has an input connected to the opposite end of one of the additional transmission lines 72 and 74, respectively, and an output connected to a corresponding one of the multicoupler outputs 62 and 64, respectively. Each of the active devices or buffer amplifiers 82 and 84 provides a desired output impedance value, typically 50 ohms, in view of the fact that transmission lines 72,74 have impedance values which are a function of the number of branches, n, rather than the standard 50 ohm or 75 ohm values.

As a result, in the multicoupler of the present invention illustrated in FIG. 3, the voltage level at each of the opposite ends or terminations of transmission lines 72,74 is substantially the same as the voltage at the input 60 advantageously resulting in substantially no degradation of signal to noise ratio. This, in turn, advantageously allows the multicoupler to be directly connected to a signal source 86 without need for a preamplifier. In addition, the transmission lines 70,72 and 74 are matched or properly terminated so as to be length-independent and frequency independent thereby advantageously resulting in broadband operation.

The signal splitting network 66 maintains the input signal voltage level, thereby causing no signal to noise degradation. The buffer amplifiers 80,82 have the one major role of maintaining proper impedance values rather than supplying high gain as in prior art arrangements wherein an amplifier precedes the power divider. Each of the two output transmission lines 72 and 74 must be terminated in its proper value. This may be accomplished solely by a resistance when the amplifier input impedance is high. This is provided by the resistors 90 and 92 in the circuit of FIG. 3. Alternatively, this can be provided by an amplifier having the proper impedance or by any combination of terminating resistance and internal impedance which matches the characteristic impedance of the transmission line. Matching impedances are indicated between the multicoupler and components of the system or circuit in which it is connected. In particular, the signal source 86 incorporates an impedance, and the resistors 96 and 98 represent load impedances. As represented in the circuit of FIG. 3, each of the transmission lines 70,72 and 74 comprises an inner conductor and a coaxial outer conductor or shield which is connected to electrical ground as indicated in FIG. 3.

The multicoupler of the present invention has a number of advantages and characterizing features. Although the power is split equally at the junction 76, the transmission line impedance is doubled. Signal voltage is not affected and is constant and equal in all of the transmission lines 70,72 and 74. Because an impedance match exists within the network, the lengths of the transmission line cables are irrelevant and may be of any length. The transmission line network is frequency-independent and inherently broadband. No resonant circuit is employed which would otherwise limit bandwidth. The network may consist of coaxial cables, microstrip, strip line or any other constant impedance medium.

The upper frequency limitation of the active devices 80 and 82 is the only bandwith effect. A proper choice of amplifier will allow operation over wide bands or selected microwave regions. Power in each leg 72,74 varies inversely to the impedance but the voltage is unchanged. Amplifiers 80 and 82 are small signal amplifiers which are operated in a linear mode and are voltage or current sensitive, not power sensitive. Because the voltage is unchanged throughout the network, the input voltage is duplicated at all output ports 62,64. No bandwidth reduction occurs within the network, therefore the input source is fully duplicated at the buffer amplifier connections.

The amplifiers are simply chosen for the particular task and many choices exist up into the microwave region. The buffer amplifier necessary at each output of the network need not have high gain to overcome following losses but only sufficient gain to maintain input and output levels. This is advantageous because high gain is likely to be detrimental when off-channel interference is present. Low amplification to accomplish the same purpose is therefore desirable, especially in strong signal areas. Failure of an amplifier causes loss of only one channel, not a catastrophic loss which would otherwise occur in prior art systems wherein the preamplifier precedes the power divider. Output port-to-port isolation is desirable and is easily accomplished by amplifier selection and good construction techniques.

The termination of the transmission line network may be solely in a resistor in each port with a non-shunting high impedance amplifier, an amplifier having an input impedance chosen for this matching purpose, or a combination of the two. Signals are duplicated simultaneously at all outputs of the transmission line network with no frequency degradation. Whatever signal degradation, or distortion occurs is as a result of amplifier operation which would have occurred in the prior art multicouplers to a larger degree. A multicoupler of the present invention comprising the transmission line network and the buffer amplifiers has no inherent signal degrading mechanism. Signal quality is maintained while multiple ports are produced in a simple, economical and easily expandable manner. No resonant circuit is involved, no lengths are critical, and size at short or long wavelengths may be large or small as desired.

By way of example, in an illustrative circuit, transmission line 70 has an impedance of 50 ohms and each transmission line 72 and 74 has an impedance of 100 ohms. Resistors 90 and 92 have magnitudes of 100 ohms each. Each matching impedance indicated by resistances 96 and 98 and of source 86 is 50 ohms.

Figure 4:
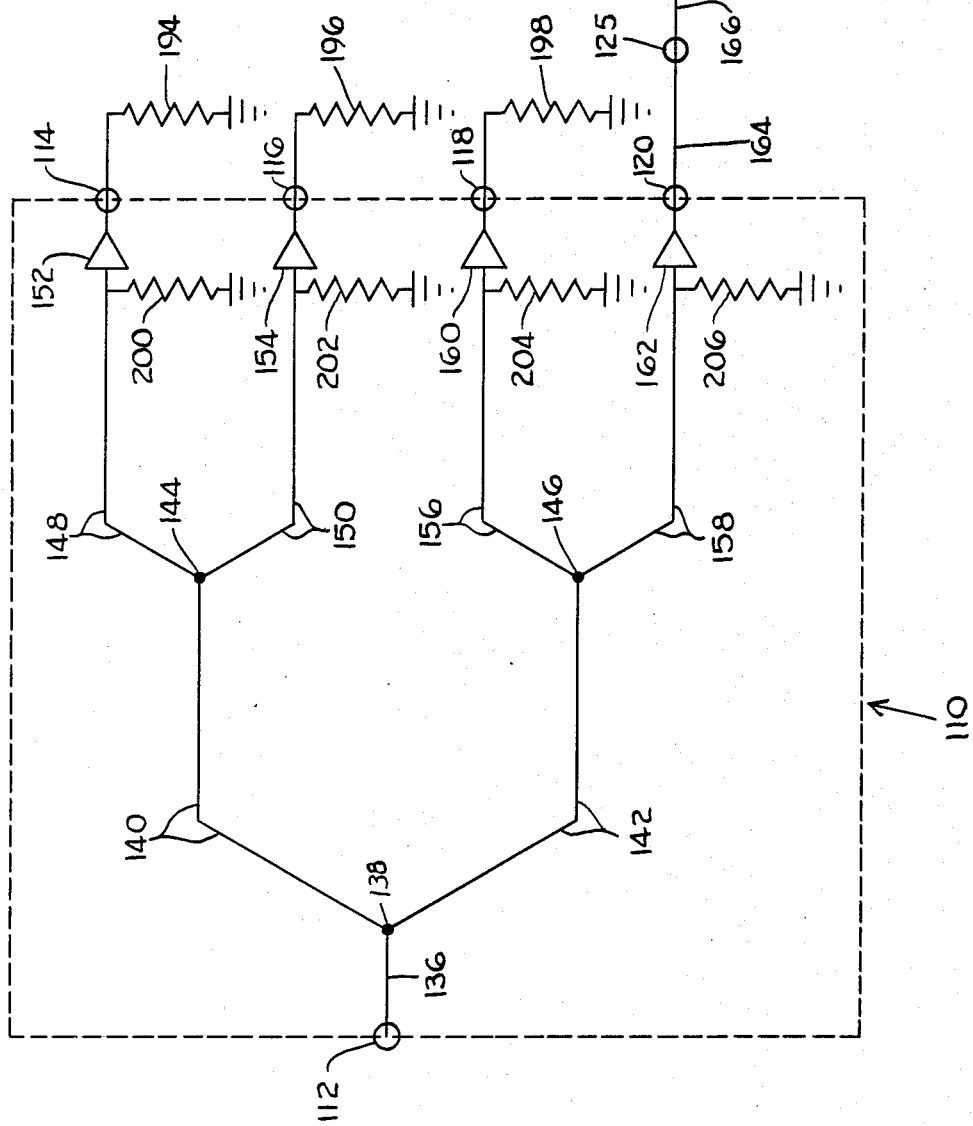
FIG. 4 is a schematic diagram of a cascaded multicoupler according to the present invention.

FIG. 4 illustrates a staged or cascaded arrangement whereby the multicoupler of the present invention is easily expandable in the number of output ports. The arrangement includes a first multicoupler generally designated 110 having an input 112 and a plurality of outputs, in the present illustration the four outputs 114, 116, 118 and 120. There is provided a second or additional multicoupler 124 according to the present invention having an input 125 connected to output 120 and having a plurality of outputs, in the present illustration four outputs 126, 128, 130, 132. Both multicouplers 110 and 124 are similar to the multicoupler of FIG. 3. In particular, input 112 is connected by transmission line 136 to junction 138 which, in turn, is connected by branch transmission lines 140 and 142 to junctions 144 and 146, respectively. Junction 144 is connected by branch transmission lines 148 and 150 to active devices or buffer amplifiers 152 and 154, respectively which, in turn, are connected to outputs 114 and 116, respectively. Similarly, junction 146 is connected by branch transmission lines 156 and 158 to active devices or buffer amplifiers 160 and 162, respectively, which, in turn, are connected to outputs 118 and 120, respectively. Output 120 of multicoupler 110 is connected through a matching transmission line branch 164 to input 125 of multicoupler 124.

In multicoupler 124, input 125 is connected by a transmission line 166 to junction 168 which, in turn, is connected by branch transmission lines 170 and 172 to junctions 174 and 176, respectively. Junction 174 is connected by branch transmission lines 178 and 180 to active devices or buffer amplifiers 182 and 184, respectively which, in turn, are connected to outputs 126 and 128, respectively. Similarly, junction 176 is connected by branch transmission lines 186 and 188 to active devices or buffer amplifiers 190 and 192, respectively which, in turn, are connected to outputs 130 and 132, respectively.

By way of example, in an illustrative circuit, transmission line 136 has an impedance of 50 ohms, each transmission line 140 and 142 has an impedance of 100 ohms, and each transmission line 148, 150, 156 and 158 has an impedance of 200 ohms. Each matching resistor 194, 196 and 198 has a magnitude of 50 ohms, and each terminating resistor 200, 202, 204 and 206 each has a magnitude of 200 ohms. Transmission line 164 has an impedance of 50 ohms, transmission line 166 has an impedance of 50 ohms, each transmission line 170 and 172 has an impedance of 100 ohms, and each transmission line 178, 180, 186 and 188 has an impedance of 200 ohms. Each matching resistor 208, 210, 212 and 214 has a magnitude of 50 ohms, and each terminating resistor 216, 218, 220 and 222 has a magnitude of 200 ohms.

By virtue of the foregoing arrangement, expansion to greater number of outputs is easily done by adding a similar circuit to one or more original outputs. Such expansion is done in a serial manner thereby making field addition easier.

Figure 5:
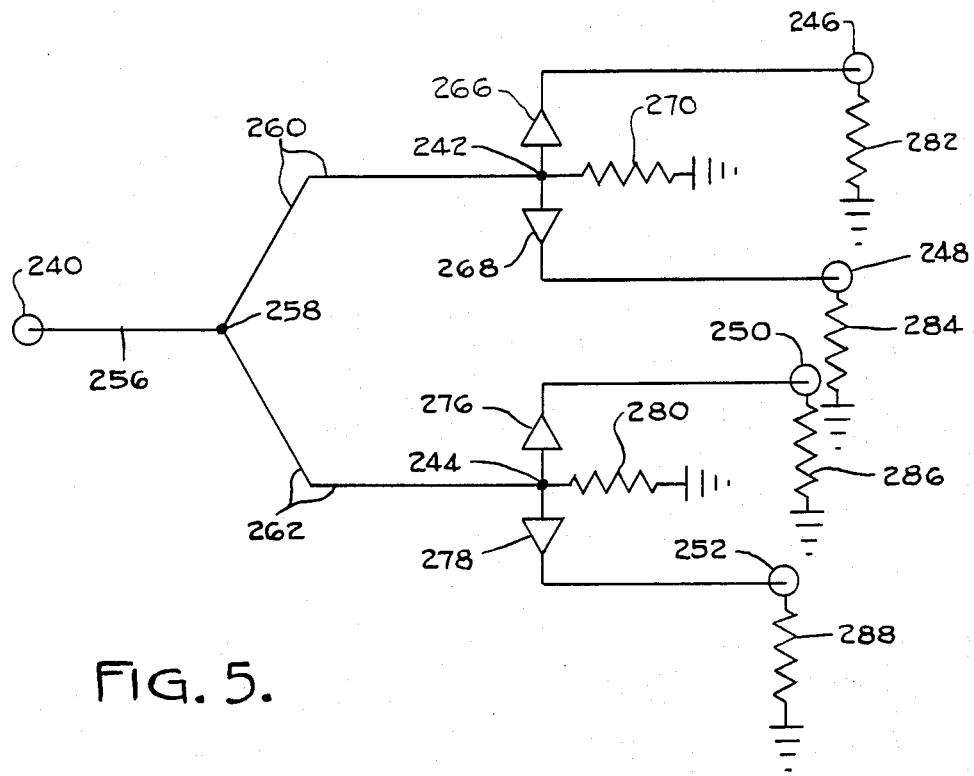
FIG. 5 is a schematic diagram of a multicoupler according to the present invention having multiple amplifiers at a terminated transmission line of the multicoupler.

FIG. 5 illustrates a multicoupler according to another embodiment of the present invention wherein more than one active device, i.e. amplifier, may be placed at the previously-mentioned amplifier-transmission line junction. As in the foregoing embodiments, the combined effect of the multiple amplifier input impedances must not be less than the desired termination value.

In particular, FIG. 5 illustrates a circuit similar to FIG. 3 having only one impedance transforming section but having two amplifiers at each transmission line termination. For the proper combination of frequency and amplifier input impedance characteristics which allow proper matched termination of each transmission line segment, multiple amplifiers may be attached to the amplifier-transmission line junction.

This illustrative circuit of FIG. 5 incldes an input 240, transmission line junctions 242 and 244 and multicoupler outputs 246, 248, 250 and 252. Input 240 is connected by transmission line 256 to junction 258 which, in turn, is connected by branch transmission lines 260 and 262 to terminations 270 and 280 at junctions 242 and 244, respectively. A pair of active devices or buffer amplifiers 266 and 268 are placed at junction 242. In particular, the input of amplifier 266 is connected to junction 242 and the output of amplifier 266 is connected to multicoupler output 246. Similarly, the input of amplifier 268 is connected to junction 242 and the output of amplifier 268 is connected to multicoupler output 248. A terminating resistor 270 is connected between junction 242 and ground. Alternatively, this can be provided by an amplifier having the proper impedance or by any combination of terminating resistance and internal impedance which matches the characteristic impedance of the transmission line.

In a similar manner, a pair of active devices or buffer amplifiers 276 and 278 are placed at junction 244. The input of amplifier 276 is connected to junction 244 and the output of amplifier 276 is connected to multicoupler output 250. The input of amplifier 278 is connected to junction 244 and the output of amplifier 278 is connected to multicoupler output 252. A terminating resistor 280 is connected between junction 244 and ground. Alternatively, this can be provided by an amplifier having the proper impedance or by any combination of terminating resistance and internal impedance which matches the characteristic impedance of the transmission line.

Matching impedances shown as resistors 282, 284, 286 and 288 are connected between multicoupler outputs 246, 248, 250 and 252, respectively, and ground. By way of example, in an illustrative circuit, transmission line 256 has an impedance of 50 ohms and each transmission line 260 and 262 has an impedance of 100 ohms. Resistors 270 and 280 have magnitudes of 100 ohms each. Each matching impedance or resistance 282, 284, 286 and 288 is 50 ohms.

Care needs to be taken with placement of the amplifier and output circuits to minimize extraneous output-output coupling, which would bypass the desired, high isolation path through the amplifier transistors. Through careful element placement and circuit design, a more economical signal splitting may result as a consequence of using fewer impedance transforming sections.

Figure 6:
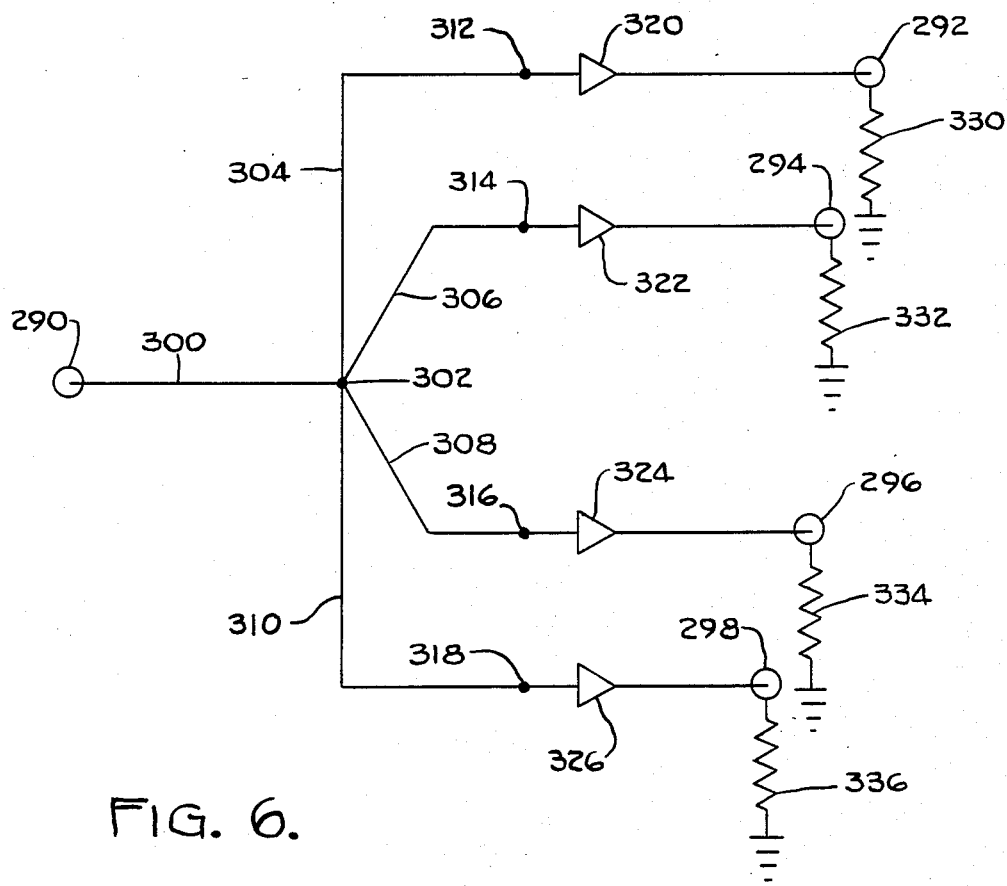
FIG. 6 is a schematic diagram of an alternative form of transmission line network for use in the multicoupler of the present invention.

FIG. 6 shows an alternative form of transmission line network which can be employed in the multicoupler of the present invention. The example of FIG. 6 includes a single impedance transforming section of four arms or branches. Four transmission lines with each being four times the input impedance value are placed at a common point.

The illustrative circuit of FIG. 6 includes an input 290 and four outputs 292, 294, 296 and 298. Input 290 is connected by transmission line 300 to junction 302 which, in turn, is connected by branch transmission lines 304, 306, 308 and 310 to junctions designated 312, 314, 316 and 318, respectively. Active devices or buffer amplifiers are connected between the junctions and the multicoupler outputs. In particular, there is provided a first buffer amplifier 320, the input of which is connected to junction 312 and the output of which is connected to multicoupler output 292. Similarly, the input of a second buffer amplifier 322 is connected to junction 314 and the output thereof is connected to multicoupler output 294. In like manner the inputs and outputs of third and fourth buffer amplifiers 324 and 326 are connected to junctions 316 and 318 and to multicoupler outputs 296 and 298, respectively.

Matching impedances shown as resistors 330, 332, 334 and 336 are connected between multicoupler outputs 292, 294, 296 and 298, respectively, and ground. By way of example, in an illustrative circuit, transmission line 300 has an impedance of 50 ohms and each transmission line 304, 306, 308 and 310 has an impedance of 200 ohms. Each matching impedance or resistance 330, 332, 334 and 336 is 50 ohms. In the circuit of FIG. 6 amplifiers 320, 322, 324 and 326 have the proper impedance to match the characteristic impedance of the corresponding transmission line. Alternatively, this can be provided by terminating resistors as in the previous embodiments or by any combination of terminating resistance and internal impedance which matches the characteristic impedance of the transmission line.

The circuit of FIG. 6 advantageously provides an impedance transformation of 50 ohms to 200 ohms in one step as compared to the several steps in going from 50 ohms to 100 ohms to 200 ohms in the embodiment of FIG. 4.

It is therefore apparent that the present invention accomplishes its intended objects. While embodiments of the present invention have been described in detail, that is for the purpose of illustration and not as limitation.

I claim:

1. A constant voltage multicoupler comprising:
    (a) a single input and a plurality of outputs;
    (b) a frequency independent, non-resonant transmission line network connected to said input and having a plurality of branches one for each of said outputs and each branch having a termination, said branches having an electrical characteristic such that the voltage is constant throughout said network; and
    (c) a plurality of active devices, at least one for each of said outputs, each of said devices having an input connected to a corresponding one of said branches at the termination thereof and an output connected to a corresponding one of said multicoupler outputs, each of said devices providing a desired output impedance value and isolation between said outputs;
    (d) so that the voltage level at each of said branch terminations is substantially the same as the voltage level at said input resulting in no degradation of signal to noise ratio.

2. A multicoupler according to claim 1, wherein each of the transmission lines of said network is properly terminated so that said transmission lines can be of any length and so that the operation of said network is frequency independent and thereby broadband.

3. A multicoupler according to claim 1, wherein said transmission line network comprises:
    a first transmission line connected at one end to said multicoupler input and terminating at the opposite end, said transmission line having a given impedance, and a plurality of additional transmission lines, one for each of said multicoupler outputs, each of said additional transmission lines connected at one end to the termination of said first transmission line at a junction and each of said additional transmission lines having a matched termination at the opposite end and connected at the opposite end thereof to the input of a corresponding one of said active devices, each of said additional transmission lines having an impedance equal to n times the impedance of said first transmission line where n equals the number of said outputs.

4. A multicoupler according to claim 1, wherein each of said active circuit means comprises buffer amplifier means having a high input impedance.

5. A multicoupler according to claim 1, in combination with a signal source connected directly to said input.

6. A multicoupler according to claim 1, in combination with another multicoupler having an input connected to one or more of said outputs to provide a cascaded arrangement.

7. A multicoupler according to claim 1, wherein a plurality of active devices are provided, each being operatively associated with a corresponding one of said multicoupler outputs.

8. A broadband, constant voltage multicoupler comprising:
    (a) a single input and a plurality of outputs;
    (b) a first transmission line connected at one end to said input and terminating at the opposite end, said transmission line having a given impedance and being properly terminated;
    (c) a plurality of additional transmission lines, one for each of said outputs, each of said additional transmission lines connected at one end to the termination of said first transmission line at a junction and each having a matched termination at an opposite end, each of said additional transmission lines having an impedance equal to n times the impedance of said first transmission line where n equals the number of said outputs, each of said additional transmission lines being properly terminated; and
    (d) a plurality of buffer amplifiers, at least one for each of said outputs, each of said amplifiers having an input connected to the opposite end of one of said additional transmission lines and an output connected to a corresponding one of said multicoupler outputs, each of said amplifiers providing a desired output impedance value and isolation between said outputs;
    (e) whereby the voltage level at each of the terminations of said additional transmission lines is substantially the same as the voltage level at said input resulting in no degradation of signal to noise ratio up to the inputs of said amplifiers and the operation of said transmission lines is length-independent and frequency-independent.

9. A multicoupler according to claim 8, wherein each of said buffer amplifiers is a high input impedance amplifier.

10. A multicoupler according to claim 8, wherein each of said buffer amplifiers is a high input impedance amplifier in combination with an external resistance.

11. A multicoupler according to claim 8, wherein each of said buffer amplifiers has an input impedance selected for matching the impedance of the transmission line connected thereto.

12. A multicoupler according to claim 8, in combination with a signal source connected directly to said input.

13. A multicoupler according to claim 8, in combination with another multicoupler having an input connected to one or more of said outputs to provide a cascaded arrangement.

14. A multicoupler according to claim 8, wherein a plurality of buffer amplifiers are provided, each being operatively associated with a corresponding one of said multicoupler outputs.

* * * * *